(12) United States Patent
Yamaguchi

(10) Patent No.: US 7,351,282 B2
(45) Date of Patent: Apr. 1, 2008

(54) CUTTING METHOD AND APPARATUS FOR INGOT, WAFER, AND MANUFACTURING METHOD OF SOLAR CELL

(75) Inventor: Sataro Yamaguchi, Aichi (JP)

(73) Assignee: Kabushiki Kaisha Y.Y.L., Tokyo (JP)

( * ) Notice: Subject to any disclaimer, the term of this patent is extended or adjusted under 35 U.S.C. 154(b) by 646 days.

(21) Appl. No.: 10/430,284

(22) Filed: May 7, 2003

(65) Prior Publication Data

US 2004/0055634 A1    Mar. 25, 2004

(30) Foreign Application Priority Data

May 8, 2002    (JP) ............................. 2002-133102

(51) Int. Cl.
*C30B 13/02*    (2006.01)
(52) U.S. Cl. .............................. 117/13; 117/15; 117/20; 83/14
(58) Field of Classification Search ................... 83/14; 117/132, 15, 20
See application file for complete search history.

(56) References Cited

U.S. PATENT DOCUMENTS

| | | | | |
|---|---|---|---|---|
| 5,279,077 A | * | 1/1994 | Miyashita et al. | ............ 451/44 |
| 5,792,566 A | * | 8/1998 | Young et al. | ................ 428/688 |
| 5,875,769 A | * | 3/1999 | Toyama et al. | .......... 125/16.01 |

FOREIGN PATENT DOCUMENTS

| | | | |
|---|---|---|---|
| JP | 2005-14241 | * | 1/2005 |
| JP | 2006-245498 | * | 6/2006 |

* cited by examiner

*Primary Examiner*—Robert Kunemund
(74) *Attorney, Agent, or Firm*—Sughrue Mion, PLLC

(57) ABSTRACT

Cutting method of ingot into wafers along cleavage plane. Onto surface of single crystal ingot 10 is implanted ion beam 23 to generate lattice defects in a direction defined by the crystal axes that corresponds to the cleavage plane. Cleavage is generated by applying a shock by a knife edge to the position of the lattice having a cutting face as a cleavage plane. Production time of wafers is reduced with a more numbers of sliced wafers from one ingot.

15 Claims, 5 Drawing Sheets

CUTTING METHOD AND APPARATUS FOR INGOT, WAFER, AND MANUFACTURING METHOD OF SOLAR CELL

FIELD OF THE INVENTION

The present invention relates to a method and apparatus for cutting a single crystal ingot, particularly a method and apparatus suitable for manufacturing a solar cell, and a wafer.

BACKGROUND OF THE INVENTION

Single crystal or polycrystal such as, for example, single crystal Si, amorphous Si or polycrystalline Si is widely used for an optoelectric conversion material (opto- voltaic material) to produce solar cells. Because, for example, amorphous Si has a forbidden band as wide as 1.7 eV and an absorption coefficient for visible light as large as ten times of single crystal Si. Additionally the single crystal Si is expensive. A solar cell made from ternary compounds of the chalcopyrite type attracts attention as a high efficiency solar cell material besides silicon, and CdS/CuInSe2 heterojunction polycrystal thin film or the like is eagerly studied, too.

Amorphous Si or polycrystalline Si is made from a single crystal ingot as a base material. Semiconductor devices, memories or logic LSIs such as CPU etc, are made on a single crystal Si wafer and are produced only from a center part or its outer part, though a marginal part and end part of the wafer are not used. Therefore, a single crystal Si wafer of a high purity is melted again and is amorphousized or polycrystallinized for use.

Recently, the silicon material to be used for solar cell is short in supply. Because the integrated density is increased by development of the fine processing technology of LSI, the productivity of LSI is increased, and thus mass-production of the Si wafer is not enough for the solar cell. Especially some unit prices of high functional and high integrated device like silicon-on-chip etc reaches a few hundred thousand yen, so the profit per wafer loading few hundred devices is high and the yield rate of products is increased, and consequently, wafers to be supplied to the solar cell production tend to be short. The amount of silicon to be supplied to the solar cell production would reach its peak approximately in 2000 to 2001 and is not supposed to increase in the near future.

However, there is a strong demand for the solar cell, and thus it is expected that the amount of solar cells in the near future will reach about 10 times of that in 2000. If the expectation of this amount would not be met, the solar cell would supply only 0.1% of the total electric power in Japan, considering the life of the solar cell. As above mentioned, there is fear about shortage of high purity silicon material for use in the solar cell under the present circumstance.

Methods of using amorphous Si or polycrystalline Si for optoelectric conversion material are under eager research. However, it is important to use the single crystal, too, because the solar cell produced from single crystal Si has a long life and a high conversion efficiency. For example, solar cells produced from single crystal Si are used for outer space or special cases.

The features of the solar cell reside in a low price and a high stability. An upper price limit of solar cells used for generating electricity on the roof of building is limited by the relation between the price of solar cell and that of electric power reduced by using an in-house generator, and thus the upper price limit cannot be increased. Solar cells produced from single crystal Si are high in price and not used in general purpose. Financial support (=50%) from the government can be received in case of introducing a solar cell (solar panel) for in-house generation of electricity on a roof etc. of a house at home. However, twice the cost is needed in practice, and it is difficult to use the single crystal Si.

The high price of solar cells using the single crystal Si is mostly caused by the cost for production of the single crystal Si. And it is difficult to drastically decrease its production cost.

Single crystal Si is produced by well-known CZ (Czochralsky) method etc. The CZ method can produce a single crystal Si ingot of a stick form ("single crystal Si ingot" is termed as "silicon ingot") which has a cross sectional diameter of at least 200 mm and a length of at least 1 m. According to the CZ method the temperature of polycrystalline silicon melted in a quartz crucible is adapted to the growth of single crystal, and seed of single crystal is soaked in the melted silicon. Then although dislocation would occur, a dislocationless state is established through necking for growing without dislocation. Controlling the speed to lift the seed of crystal and the temperature of the melted silicon, the diameter of the single crystal is gradually increased, until forming a shoulder part with a desired diameter, followed by forming a straight body part, and successively and gradually decreasing the diameter of the single crystal to form a tail part of a reverse conical shape, whereupon the CZ method is completed.

A cutting machine equipped with a wire saw 11 cuts a hard fragile silicon ingot 10 to produce wafers of thin sheet for manufacturing a solar cell, as shown in FIG. 3. Using a rotating thin blade edge (for example, having a thickness of 10 to a few 10 microns), internal edge cutting or outer edge cutting is executed. Then, the wafer is processed by rough grinding (lapping) and mirror grinding (polishing), and a mask is applied on the surface of the wafer. An impurity diffusion layer is formed by injection of an impurity, a PN junction is made, and a metal film is deposited followed by forming a pattern for electrodes and wiring, resulting in, solar cells.

For an approximately cylindrical silicon ingot 10 that is a base material of the semiconductor wafer, a single crystal is produced so as to conform a lattice plane (001) of the single crystal with a plane perpendicular to z-axis, where the direction of cylindrical height is z-axis, and two axes defining the plane perpendicular to z-axis are x and y-axes. Then (100) plane is cut out at a side of the cylinder. The surface of the resultant semiconductor wafer made from the single crystal becomes the (001) plane ((001) plane is used in general.). On this occasion the silicon ingot 10 is cut in a (plane) direction perpendicular to z-axis into a plurality of cut pieces to provide wafers of an approximately disk shape. The resultant cut (100) plane is called "orientation flat".

Cutting margin and thickness are needed when a silicon ingot 10 is cut into wafers by using a wire saw 11. The thickness of the wire saw 11 is thin (0.2 mm to 11.0 mm) for shortening the cutting margin. However, the thickness of wafer needs certain thickness T (0.3 mm to 11.0 mm) for cutting at a high cutting speed. The movement of the wire saw 11 is not reciprocal but one way. The wire saw is explained in FIG. 3 for simplicity, as an example. There are various kinds of cutting (slicing) machines to cut the single crystal ingot, such as internal edge cutting machine, outer edge cutting machine, cutting machines with rotating ingot, horizontal and vertical type cutting machines.

For example, silicon wafers from 500 pieces (assuming cutting margin=11.0 mm, and thickness=11.0 mm) to 2000 pieces (assuming cutting margin=0.2 mm, and thickness=0.3 mm) can be cut out from a silicon ingot of lm in length. Cutting out wafers need many hours, for example, 8 hours Lo cut out 300 wafers.

SUMMARY OF THE DISCLOSURE

Assume that for instance, 2500 wafers can be cut out from a silicon ingot of 1 m in length, solar cells can be manufactured at an equal cost with the case of current polycrystalline silicon, and solar cells using the single crystal can be used in general purpose. However, the present status would be nearly at a technical limit.

The solar cell needs absorption of light and has a limitation in the thickness because of certain extent of required strength for processing. Considering those conditions as a whole, it is known as sufficient for the wafer to have a thickness of at least 0.1 mm.

Therefore, 10,000 wafers can be produced from a silicon ingot of 1 m in length in theory.

When any manufacturing method is established, solar cells using the single crystal silicon will become popular widely. Especially, the solar cells using the single crystal silicon have a conversion efficiency at least twice in comparison with the case of amorphous silicon and can yield the same power at a half area on the roof, showing that it is a very important technical development to develop the solar cell using the single crystal silicon.

Accordingly, it is an object of the present invention to provide a method and an apparatus that specially shortens the time to cut a single crystal ingot to produce wafers.

It is another object of the present invention to provide a method and an apparatus that enables to produce more and thinner wafers from one ingot.

It is a further object of the present invention to provide a method and an apparatus that enable to produce wafers having a high purity and a high surface precision.

According to an aspect of the present invention, there is provided a cutting method wherein an approximately cylindrical ingot being a base material of wafer is cut into slices.

The method comprises:

(a) a step of irradiating partly or entirely circumferentially of a surface of the ingot with a working beam in a circumferential direction of the ingot, (b) a step of generating cleavage at a position of the ingot irradiated with the beam to cut the ingot into a wafer providing a cutting face that corresponds to a plane of the cleavage.

The working beam comprises an ion beam or an electron beam, preferably.

According to another aspect of the present invention, there is provided a cutting method comprising:

(a) a step of generating lattice defects in a surface of a single crystal ingot along a direction defined by crystal axes, said direction corresponding to a cleavage plane in a crystal structure, (b) a step of cleaving the ingot by applying a shock (or shocks) to the lattice defects in said surface of the single crystal ingot, thereby cutting the ingot into a wafer having a cutting face formed as the cleavage plane.

According to a further aspect of the present invention, there is provided a cutting apparatus wherein an approximately cylindrical ingot being a base material of wafer is cut into slices.

The apparatus comprises:

(a) first means for irradiating partly or entirely circumferentially of a surface of the ingot with a working beam in a circumferential direction of the ingot, (b) second means for generating cleavage at a position of the ingot irradiated with the beam to cut the ingot into a wafer to provide a cutting face that corresponds to the cleavage.

In the cutting apparatus, the working beam is an ion beam from an ion source or an electronic beam from an electronic source.

According to a still further aspect of the present invention, there is provided a wafer. The wafer is formed of a slice cut out from an ingot being a base material, and the wafer has a surface defined by a cleavage plane at a position of said ingot irradiated with a working beam in a circumferential direction of the ingot.

According to a yet further aspect of the present invention, there is provided a solar cell comprising: a wafer and a PN-junction formed on a surface of the wafer in which the surface corresponds to a plane of cleavage generated in an ingot. The cleavage is formed at a position of the ingot irradiated with a beam, and the wafer has the surface that corresponds the plane of the cleavage resulting from cleaving of the ingot, partly or entirely circumferentially of a surface of the ingot being irradiated with a working beam in a circumferential direction of the ingot.

According to a yet another aspect of the present invention, there is provided a manufacturing method of a solar cell. The method comprises:

(a) a step of irradiating partly or entirely circumferentially of a surface of an ingot with a working beam in a circumferential direction of the ingot, (b) a step of generating cleavage at a position of said ingot irradiated with the beam to cut the ingot into a wafer to provide a surface that corresponds to a plane of the cleavage, and (c) a step of forming PN-junction on the surface of the wafer.

According to a further aspect of the present invention, there is provided a cutting apparatus for cutting an ingot into slices. The cutting apparatus comprises:

a first unit that generates lattice defects in the surface of a single crystal ingot along a direction defined by crystal axes which corresponds to a cleavage plane in a crystal structure, and a second unit that applies a shock (or shocks) to said lattice defects in the surface of the single crystal ingot, wherein the single crystal ingot is cut into a wafer with a cutting face formed as the cleavage plane.

Figure 1:
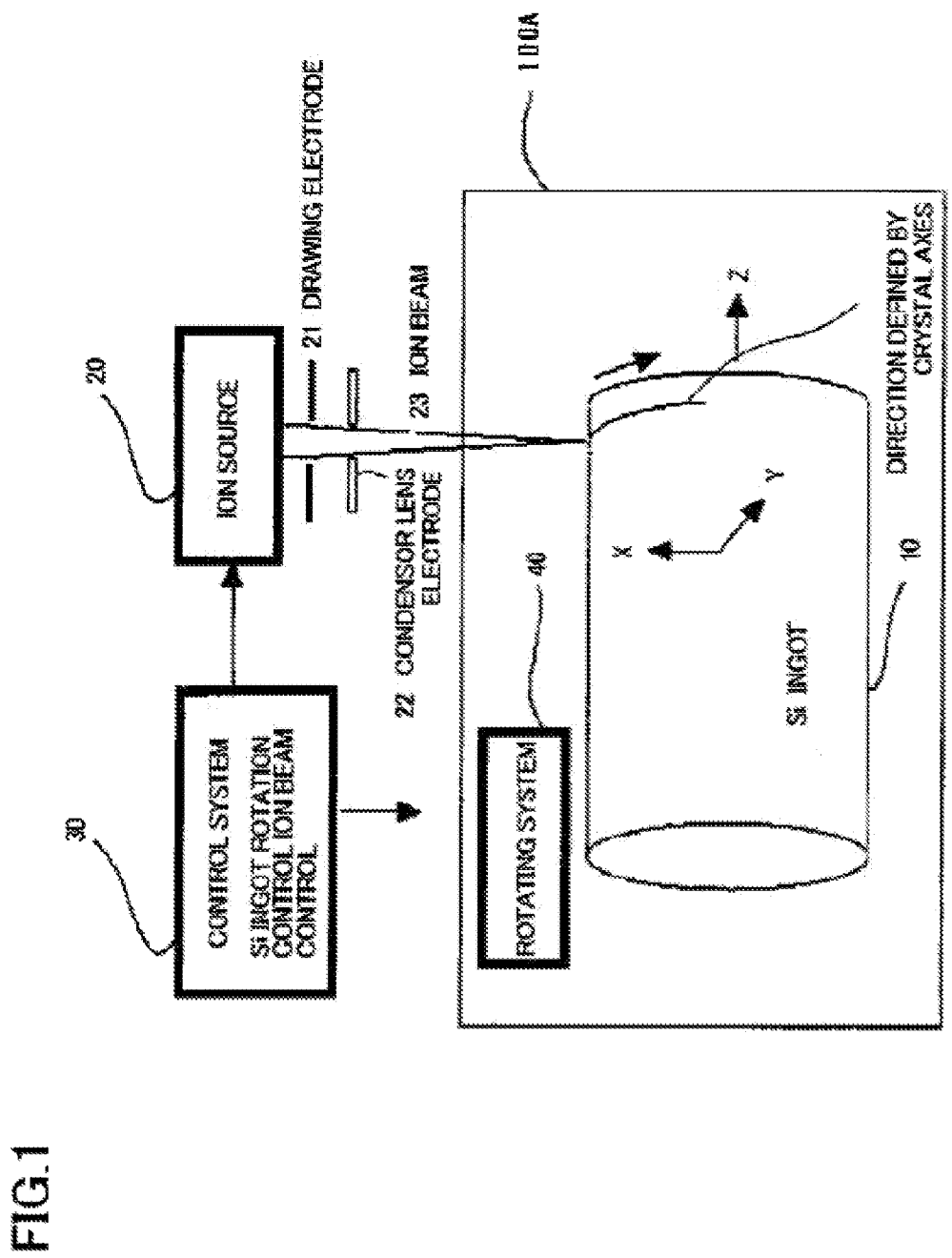
FIG. 1 schematically shows a structure of an embodiment of the present invention.

FIG, 5 schematically shows a collector plate with the electron beam.

DESCRIPTION OF THE PREFERRED EMBODIMENTS

The outline, principle and embodiments of the present invention are described as follows.

A method of the present invention comprises the following steps.

Step 1: Generating lattice defects in a (side) surface of a straightbody of a single crystal ingot along a direction defined by crystal axes, the direction corresponding to a cleavage plane in a crystal structure, Step 2: Cleaving the ingot by applying a shock to a position where lattice defects have been generated by the Step 1, in the surface of the single crystal ingot, thereby cutting the ingot into a wafer having a cutting face formed as the cleavage plane.

In Step 1, the lattice defects are generated in the surface of the single crystal ingot along the direction defined by crystal axes, by irradiating the surface of the single crystal ingot with a working (or processing) beam along the direction defined by crystal axes.

The lattice defects may be generated in the surface of the single crystal ingot circumferentially of the surface of the single crystal ingot in the Step 1 by relatively rotating said single crystal ingot and a source of said working beam.

The working beam comprises an ion beam from an ion source, or an electron beam from an electronic source.

The cleavage may be generated by applying a shock of a knife-edge to the position where the lattice defects have been generated in the surface of the single crystal ingot in the Step 2.

Plural cleavages may be at once generated by applying plural shocks of plural knife-edges to positions where the lattice defects have been generated at a plurality of cleavage planes in the surface of the single crystal ingot in the Step 2, respectively, the cleavage planes being disposed spaced apart from one another in a longitudinal axis of the single crystal ingot.

The cleavage may be generated by applying a shock (or shocks) to the lattice defects in the surface of the single crystal ingot, while both ends of the ingot are retained in the Step 2.

The cleavage may be generated by applying a shock (or shocks) to the lattice defects while the single crystal ingot is soaked in a liquid 111A, in the Step 2.

The cutting apparatus according to the present invention comprises:

a first unit that generates lattice defects in the surface of a single crystal ingot along a direction defined by crystal axes which corresponds to a cleavage plane in a crystal structure (refer to FIG. 1) and a second unit that applies a shock (or impacts) to said lattice defects in the surface of the single crystal ingot, wherein the single crystal ingot is cut into a wafer with a cutting face formed as the cleavage plane. The single crystal ingot may comprise single crystal silicon or single crystal arsenic gallium.

The first unit comprises an ion source (20) and a control unit (21, 22, 30) that condenses an ion beam from the ion source, the first unit generating the lattice defects in the surface of the single crystal ingot by irradiating the surface with the ion beam. Also, the first unit may comprise an electronic source and a control unit that condenses an electronic beam from the electronic source, wherein the first unit generates the lattice defects in the surface of the single crystal ingot by irradiating the surface with the electronic beam.

The first unit may comprise a mechanism for rotating relatively said single crystal ingot and the ion source (or electron source) thereby making the lattice defects in the surface of the single crystal ingot circumferentially of the surface.

The second unit may comprise a knife-edge and a control unit that controls position(s) of the knife-edge relative to the single crystal ingot. The second unit generates the cleavage by applying a shock (or impacts) of the knife-edge to a position(s) where the lattice defects have been generated, e.g., circumferentially of the surface of the single crystal ingot.

The second unit may comprise plural knife-edges to simultaneously generate plural cleavages together by applying plural shocks (impacts) of plural knife-edges to the lattice defects extending circumferentially of the surface of the single crystal ingot, the lattice defects being disposed at a plurality of cleavage planes spaced apart from one another in a direction longitudinal of the ingot.

The second unit may comprise a mechanism for holding both ends of the single crystal ingot, in which state the cleavage can be produced by applying a shock(s).

An exemplary embodiment of a cutting method of a single crystal ingot according to the present invention utilizes the cleavage as its principle. The cleavage of the single crystal is a phenomenon to split instantaneously with respect to a direction of the crystal axis, upon applying a knife-edge in a direction defined by the crystal axis or axes. The resulting surface of the cleavage has a flatness and less impurity, and on this surface many processes for providing semiconductor devices are made. For example, the cleavage plane of a single crystal has a micro-height such that the unevenness (up and down) of the surface is "a reverse of a few times"(e.g. half to a third) of the atomic size in a case where atoms on the surface are densely arranged. A procedure of cutting is described as follows.

The splitting in the direction defined by the crystal axes through the cleavage is caused by the lattice defects. Thus in the present invention, the lattice defects are produced in a single crystal ingot to be processed to a base material of semiconductor wafers. For example, ion beam is impinged (implanted) on (into) the surface of a single crystal ingot because impurity atoms cause the lattice defects in general.

An exemplary embodiment of the present invention is described with reference to the figures. FIG. 1 schematically shows a structure of an exemplary embodiment of the present invention. An apparatus according to the exemplary embodiment of the present invention comprises an ion source 20, an ion emitting electrode 21 and a condenser lens electrode 22 so as to condense ion beam 23 onto the surface of silicon ingot 10.

The lattice defects are generated on the surface because the mean free path of ion beam 23 in the surface of silicon ingot is short. The scanning direction of the ion beam 23 is along a "direction defined by crystal axes" (i,e, along a direction of a plane defined by x-and y-axes or a direction defined by a plane transverse to z-axis) of the silicon ingot 10 shown in FIG. 1.

It is possible that a mask (not shown in the figures) of a pattern having an open part irradiated with ion beam 23 covers silicon ingot 10.

In producing the approximately cylindrical silicon ingot 10 being a base material of semiconductor wafer, a single crystal is produced such that a lattice plane (001) of the single crystal coincides with a plane perpendicular to z-axis, provided that the axial (longitudinal) direction of the cylinder is z-axis and two axes defining a plane perpendicular to z-axis are x-axis and y-axis. In this case, the cleavage plane is the lattice plane in FIG. 1 and the "direction defined by crystal axes" is a direction circumferentially of the cylinder about z-axis defined by x-axis or y-axis, wherein z-axis is along the direction of the height of the cylinder. The lattice defects introduced by irradiating with ion beam are point defects or linear defects (dislocation) etc.

The ion beam may be impinged (implanted) along the direction defined by crystal axes, rotating about the center axis of silicon ingot 10 with a rotating system (rotating driving system) 40. In this method of rotating and irradiating, it is expected that cleavage is more easily made. It is possible that the silicon ingot 10 is fixed and the ion source 20 rotates around the silicon ingot 10 instead of rotating the silicon ingot 10, as a mechanism of the rotating driving system 40.

A control system 30 controls to keep and rotate the ingot for rotating the silicon single crystal 10 about the center axis.

The control system 30 has a control unit, too, that controls always to keep a best condensing position (or spot) of ion beam 23. The control system 30 controls, for example, the voltage of a drawing electrode 21 and a condensor lens electrode 22, and ion energy, beam current and incident angle (direction) of the ion beam. The control system 30 controls the position of the ingot, in association with the control system to control the rotating system 40 according to the position information system measured by a measuring system (not shown). As an ion source 20 use is made of a DC discharge type (for example, Kaufmann type, barrel type), RF or ECR type using high frequency wave or microwave, etc. as well known. The silicon ingot 10 is loaded in an airtight chamber 100A kept at a vacuum and is processed by ion beam.

Then the surface of the straight body (cylindrical side surface) of silicon ingot is irradiated with ion beam 23 along the direction defined by the crystal axes step by step forming circumferential beam lines parallel one another to form linear plural lattice defects, apart from one another at a distance in the axial direction of the cylindrical crystal.

It is possible to use an electronic beam as a working or processing beam to form the lattice defects. Being irradiated with the electron beam, electrons are reflected to the exterior by elastic collision with surface atoms of the ingot (solid body), repeat non-elastic collisions with atoms constituting the solid, and then the electrons penetrate into the solid, losing the energy. At this moment, generation of heat, excitation of solid atoms, ionization, and generation of secondary electrons and X-ray occur. The lattice defects are generated when the surface of ingot has a partially high temperature by irradiation with the electron beam resulting in a crystal lattice strained with dislocation etc. In case of using electron beam, a filament (cathode) emitting electrons is used instead of the ion source 20, and an electron beam system having control electrode (grid), anode, condenser lens and deflection coil is used. It is possible to cover silicon ingot 10 irradiated with electron beam by a mask (not shown in the figures) having a pattern of an open part.

Figure 2:
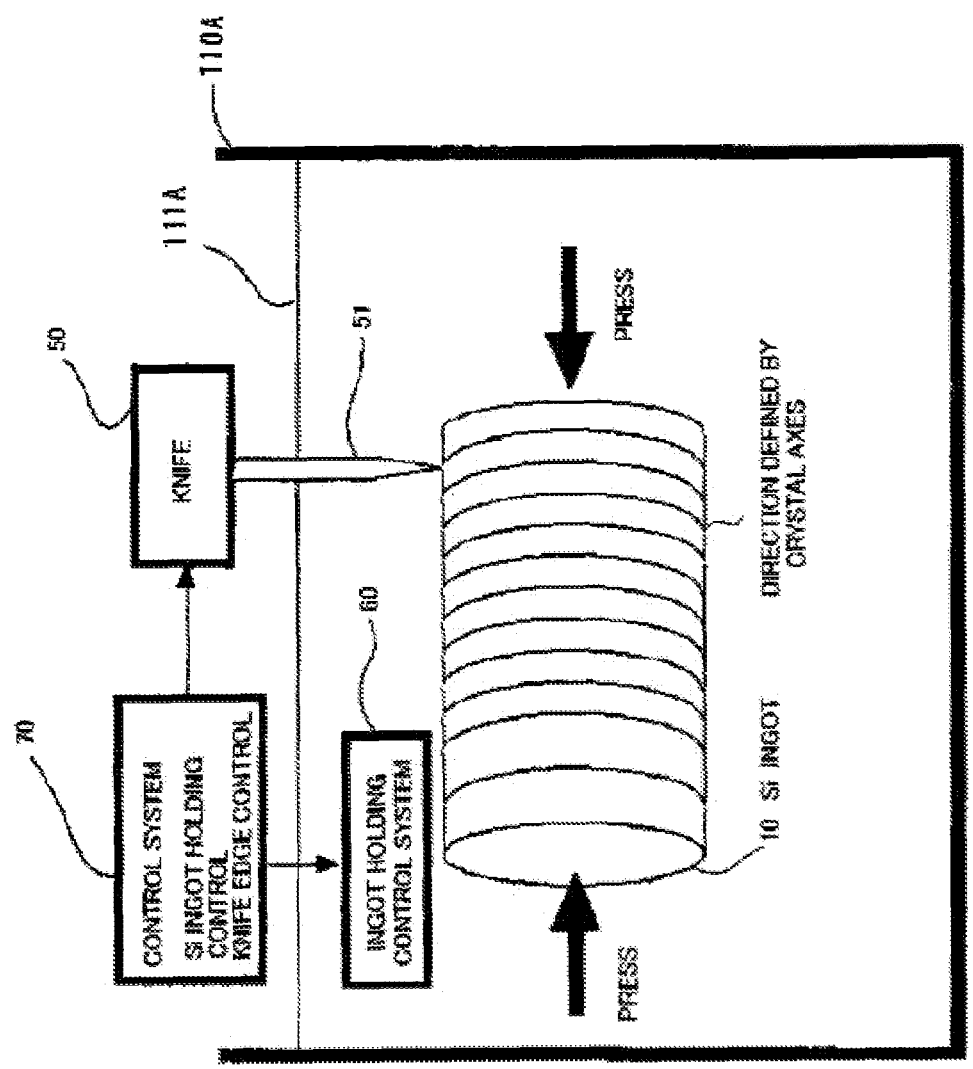
FIG. 2 schematically shows a structure of an embodiment of the present invention.
Figure 3:
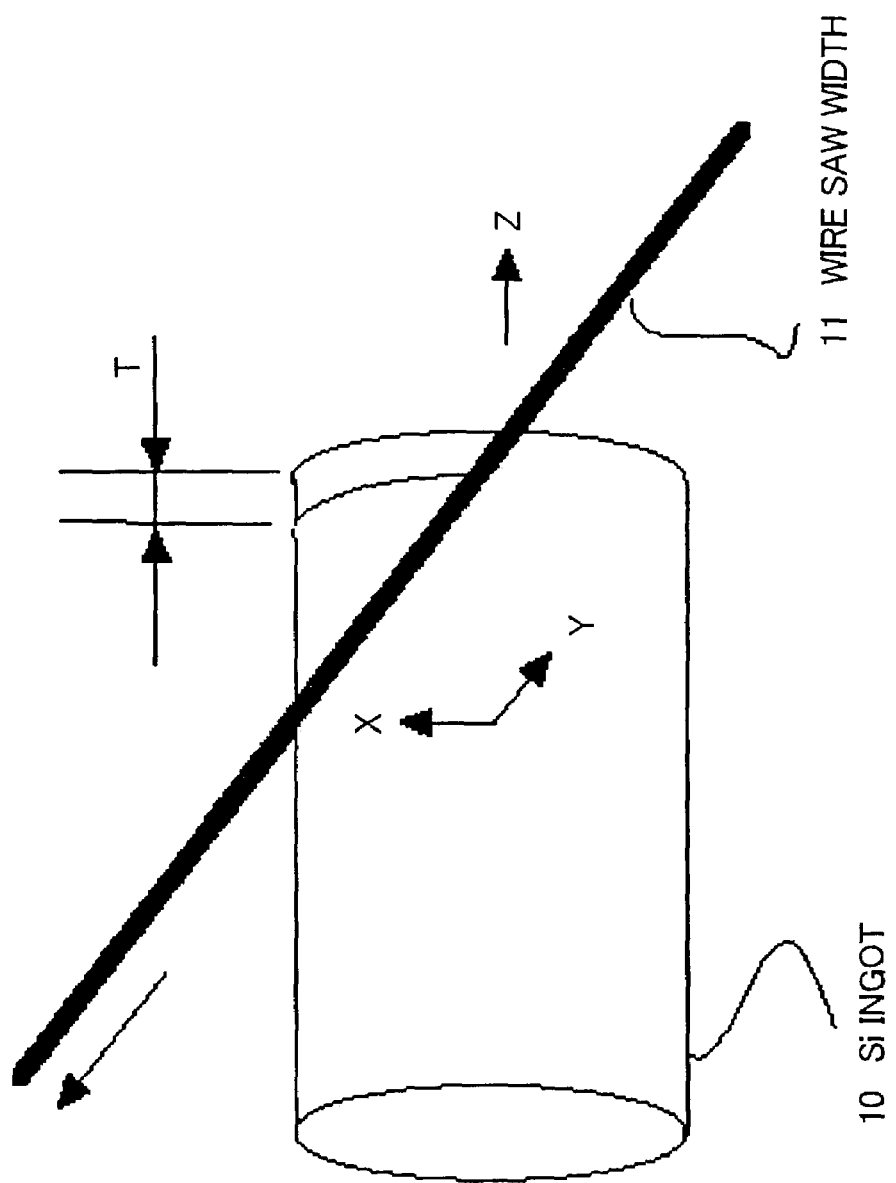
FIG. 3 schematically shows a conventional cutting method.

It is possible to use a non-charged particle beam (neutral beam) having a good beam directivity as a working beam to produce lattice defects. p Then the silicon ingot 10 is taken out (unloaded) from the chamber 100A, and a knife-edge 51 extending from a knife 50 is applied to the position(s) of the surface of silicon ingot 10 having the lattice defects as shown in FIG. 2. The knife-edge 51 is positioned at right angles to the direction of the length (axis) of the silicon ingot 10.

Then cleavage is generated from the position having the lattice defects (for example dislocation etc.) in the silicon ingot 10, with a shock or impact (for example mechanical shear stress) of the knife-edge 51 to this position. The "cleavage" means splitting into two parts having a splitting plane at a lattice plane in a crystal. Alternatively it is possible to produce the cleavage at the position having lattice defects (for example dislocation etc.) in the silicon ingot 10 by irradiating a powerful electron beam from an electron source. The lattice defects may be produced by laser beam, too.

The cleavage in the silicon ingot 10 occurs instantaneously, and consequently the cutting process is finished in a short period of time.

A holding system (not shown in the figures) is installed, that presses the right and left ends of ingot 10 (the bottom face and the opposite face of the cylinder column) shown in FIG. 2, holding the silicon ingot 10 to secure against the shock from the knife-edge 51. It is possible to install the holding system not shown in the figures, that comprises a pressing control system equipped with a spring or cylinder (hydraulic pressure) to press the right and left ends of the ingot 10 shown in FIG. 2 with a biasing (resilient) force.

The cleavage is produced by positioning the knife-edge 51, typically, step by step at plural positions provided with lattice defects to the surface of the silicon ingot 10 with ion beam followed by application of a shock. In this positioning, it is possible either to move the knife-edge 51 along the direction of the length of silicon ingot 10, or to move the silicon ingot 10 relative to the knife-edge 51.

A control system 70 controls to move the knife-edge 51 to the position irradiated with ion beam 23 in the silicon ingot 10. Correct information is acquired, as the computer constituting the control system 70 acquires information of the location (position information) irradiated with the ion beam from the control system 30 controlling the ion source.

In FIG. 2, a structure with one knife-edge 51 is shown, but it is possible to provide plural cleavages in plural positions at once with plural knife-edges. On this occasion, the plural knife-edges 51 shown in FIG. 2 are applied to a plurality of positions spaced apart from each other in the direction of the length of the silicon ingot 10, and are positioned on the surface having lattice defects in the silicon ingot 10. In the same way, it is possible to make the plural cleavages at the plural positions having lattice defects in the silicon ingot 10, by irradiating these positions with a powerful electronic beam or beams.

It is possible to apply a shock to the silicon ingot 10 and the knife-edge 51 in water (pure water), for example, in order to facilitate the cleavage. Alternatively, it is possible to use certain liquid 111A instead of water.

Figure 4:
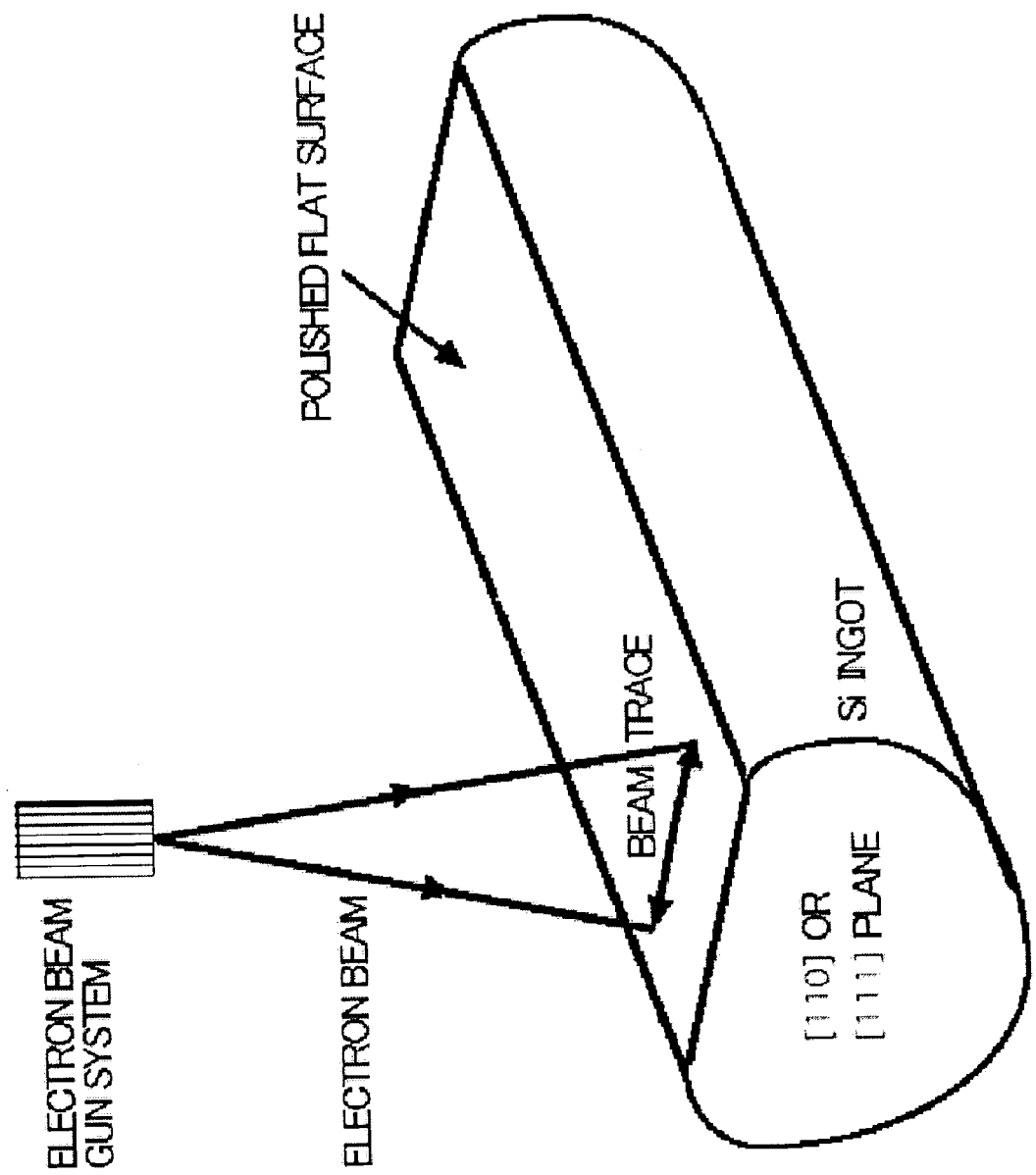
FIG. 4 schematically shows a polished flat surface with the electron beam.

FIG. 4 shows that a polished flat surface is used in the orientation of the beam. The polished flat surface is perpendicular to the cleavage plane. By the polished flat surface, it becomes easy to adjust a beam optical system.

Figure 5:
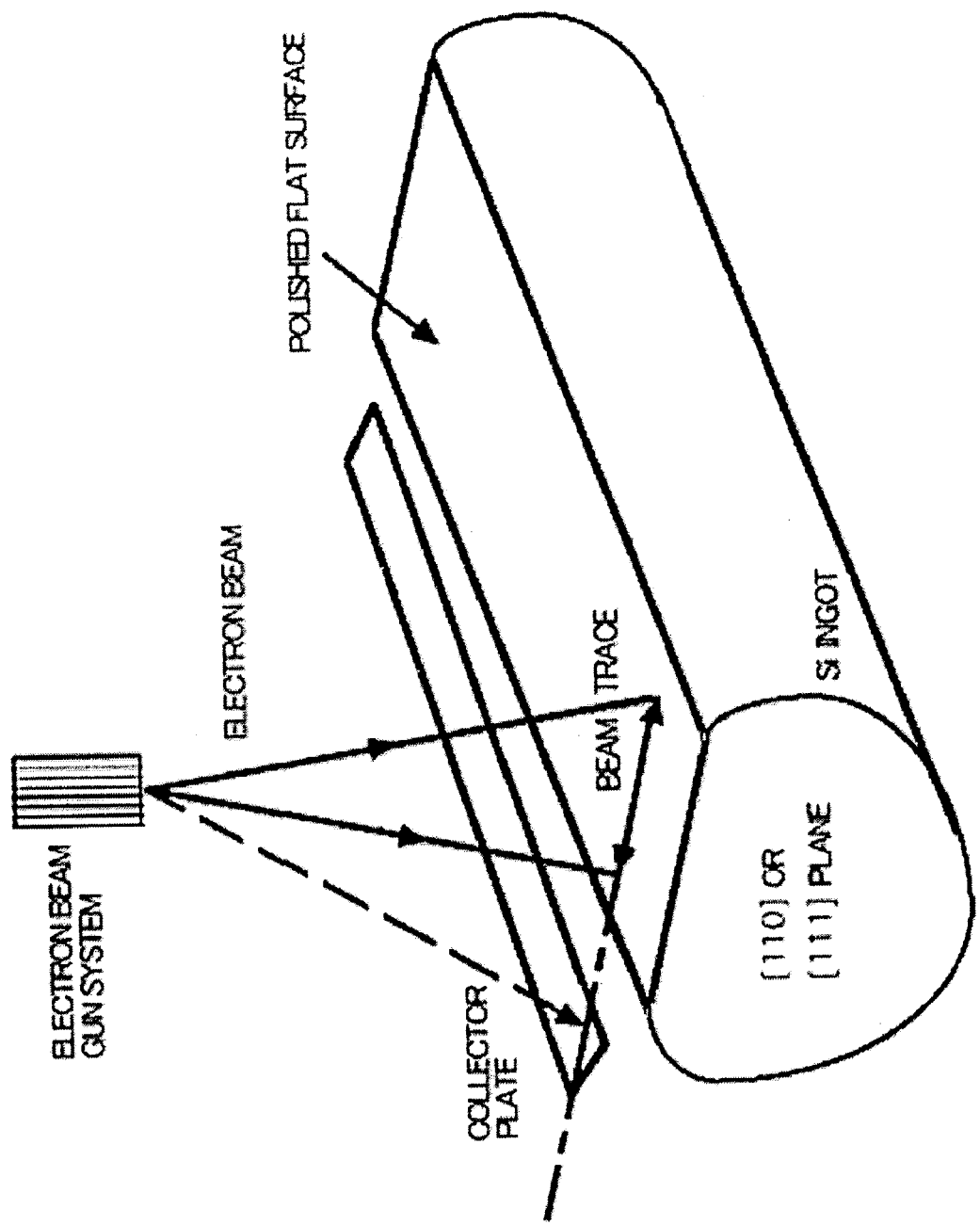

FIG. 5 shows that a collector plate is used for irradiation with the electron beam in order not to irradiate a material of a semiconductor while the material is not processed by the electron beam (until the electron beam becomes stable).

Resultant cut wafers are passed in a series of processes, chamfering, lapping, heat treatment, polishing, etc., and are supplied to a further manufacturing process of objective solar cells. The manufacturing process comprises, a step of forming a PN-junction by forming an n+ impurity layer on a P type single crystal Si wafer with vapor-phase diffusion, coating diffusion, or ion implantation, a step of forming a front electrode with a transparent conductive material and a step of forming the back (counter) electrode. It is possible to form a fine low (for example, 1 to 2 microns) pyramidal unevenness on the surface of the solar cell to decrease the surface reflection by multi-reflection (CNR (Comsat Non Reflective) Solar Cell), suppressing the lowering of efficiency caused by the light reflection on the surface of solar cell.

In the above-mentioned embodiment, the single crystal Si is used, but it is possible to use semiconductor materials of III-V family compound, for example, single crystal GaAs.

According to the above-mentioned embodiment using cleavage to cut the ingot into thin slices, there are following functions and effects.

In the above-mentioned embodiment, no saw is used and thus there is no cutting margin caused by the blade thickness of the saw. Therefore, more wafers can be produced, and thin wafers can be produced. According to the above-mentioned embodiment, a few thousands or more (doubled) wafers can be produced from a silicon ingot of lm in length in principle.

In the above-mentioned embodiment, there is no debris of saw on the cutting face of wafer, and the resultant wafers have a high purity and a high surface precision.

And the cleavage is generated at instant, and thus it is possible to reduce the cutting time of wafers to decrease the production cost.

In the above-mentioned embodiment, the atomic arrangement on the cleavage plane is uniform, and thus it is possible to produce solar cells easily. Wafers cut out of the ingot using cleavage have excellent characteristic of the more precise surface than wafers cut by a blade etc. Process of mirror grinding is easy, and thus it is possible to further decrease the production cost.

According to the above-mentioned embodiments, the present invention gives an important technical solution for producing solar cells with the silicon single crystal or GaAs single crystal. It is possible to use the cut wafers according to the above-mentioned embodiment for manufacturing of any semiconductor devices other than the solar cell.

The meritorious effects of the present invention are summarized as follows.

According to the present invention, there is no cutting margin caused by using a saw for cutting the ingot, it is possible to produce more thin slices.

Moreover, according to the present invention, there is no cutting margin produced by using the saw, it is possible to produce thin wafers.

Moreover, according to the present invention, there is no debris of saw on the cutting surface of wafer, and thus it is possible to produce wafers that have a high purity and a high precision of surface.

According to the present invention, the cleavage is generated at instant, and it is possible to reduce the cutting time of wafers and to decrease the cost of product of wafers.

According to the present invention, the atomic arrangement on the cleavage plane is uniform, and it is possible to produce solar cells easily. According to the present invention, it is possible to decrease the cost for producing solar cells.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A cutting method comprising:
   (a) a step of generating lattice defects in a surface of a single crystal ingot along a direction perpendicular to a central longitudinal axis of said ingot, said direction corresponding to crystal axes of said ingot, and said direction corresponding to a cleavage plane in a crystal structure of said ingot,
   (b) a step of cleaving the ingot by applying a shock to said lattice defects in said surface of the single crystal ingot, thereby cutting the ingot to form a wafer having a cutting face formed as said cleavage plane.

2. A cutting method as defined in claim 1 wherein
   the lattice defects are generated in the surface of the single crystal ingot along the direction defined by crystal axes in said step (a), by irradiating said surface of the single crystal ingot with a working beam along the direction defined by crystal axes.

3. A cutting method as defined in claim 2 wherein
   the lattice defects are generated in the surface of the single crystal ingot circumferentially of the surface of the single crystal ingot in said step (a) by relatively rotating said single crystal ingot and a source of said working beam.

4. A cutting method as defined in claim 2 wherein said working beam comprises an ion beam from an ion source.

5. A cutting method as defined in claim 2 wherein said working beam comprises an electronic beam from an electronic source.

6. A cutting method as defined in claim 1 wherein
   said cleavage is generated by applying a shock of a knife-edge to said lattice defects in said surface of the single crystal ingot in said step (b).

7. A cutting method as defined in claim 6 wherein plurality of cleavages are generated simultaneously by applying a plurality of shocks of plural knife-edges to said lattice defects at a plurality of cleavage planes in said surface of the single crystal ingot in said step (b), respectively, said cleavage planes being disposed spaced apart from one another along the central longitudinal axis of the single crystal ingot.

8. A cutting method as defined in claim 1 wherein
   said cleavage is generated with a shock of an electronic beam to said lattice defects in said surface of the single crystal ingot in said step (b).

9. A cutting method as defined in claim 8 wherein a plurality of cleavages are generated with shocks of plural electronic beams to said lattice defects at a plurality of cleavage planes in said surface of the single crystal ingot, said cleavage planes being disposed spaced apart from one another along the central longitudinal axis of the single crystal ingot.

10. A cutting method as defined in claim 6 wherein
    said cleavage is generated by applying a shock to said lattice defects in said surface of the single crystal ingot, while both ends of the ingot are retained in said step (b).

11. A cutting method as defined in claim 1 wherein
    said cleavage is generated by applying a shock to said lattice defects in said surface of the single crystal ingot soaked in a liquid, in said step (b).

12. A cutting method as defined in claim 1 wherein
    said single crystal ingot comprises single crystal silicon or single crystal arsenic gallium.

13. A cutting method as defined in claim 1, wherein
    said wafer is formed of a round slice cut out from the ingot being a base material,
    said wafer has a surface defined by a cleavage plane at a position of said ingot irradiated with a working beam in a circumferential direction of said ingot.

14. A cutting method for slicing
an approximately cylindrical ingot into wafers,
said method comprising:
(a) irradiating at least partly circumferentially of a surface of said ingot with a working beam in a circumferential direction of said ingot, said circumferential direction being perpendicular to a central longitudinal axis of said ingot; and (b) generating cleavage at a position of said ingot irradiated with said beam to cut said ingot into a wafer providing a cutting face that corresponds to a plane of said cleavage.

15. A cutting method as defined in claim 14 wherein said working beam comprises an ion beam or an electron beam.

* * * * *